(12) United States Patent
Mai

(10) Patent No.: US 7,656,988 B2
(45) Date of Patent: Feb. 2, 2010

(54) START UP CIRCUIT FOR DELAY LOCKED LOOP

(75) Inventor: Tony Mai, Kanata (CA)

(73) Assignee: MOSAID Technologies, Inc., Ottawa, Ontario (CA)

( * ) Notice: Subject to any disclaimer, the term of this patent is extended or adjusted under 35 U.S.C. 154(b) by 0 days.

(21) Appl. No.: 12/315,289

(22) Filed: Dec. 2, 2008

(65) Prior Publication Data

US 2009/0086876 A1    Apr. 2, 2009

Related U.S. Application Data

(63) Continuation of application No. 10/647,664, filed on Aug. 25, 2003, now Pat. No. 7,477,716.

(60) Provisional application No. 60/482,260, filed on Jun. 25, 2003.

(51) Int. Cl.
*H03D 3/24* (2006.01)
(52) U.S. Cl. ................ 375/376; 375/374; 375/375
(58) Field of Classification Search .......... 375/373–376
See application file for complete search history.

(56) References Cited

U.S. PATENT DOCUMENTS

| | | | | |
|---|---|---|---|---|
| 5,857,005 | A | * | 1/1999 | Buckenmaier .............. 375/357 |
| 5,994,934 | A | | 11/1999 | Yoshimura et al. |
| 6,088,255 | A | | 7/2000 | Matsuzaki et al. |
| 6,100,736 | A | | 8/2000 | Wu et al. |
| 6,166,990 | A | | 12/2000 | Ooishi et al. |
| 6,215,343 | B1 | | 4/2001 | Birru |
| 6,239,634 | B1 | | 5/2001 | McDonagh |
| 6,285,225 | B1 | | 9/2001 | Chu et al. |
| 6,314,052 | B2 | | 11/2001 | Foss et al. |
| 6,314,150 | B1 | | 11/2001 | Vowe |
| 6,330,296 | B1 | | 12/2001 | Atallah et al. |
| 6,337,590 | B1 | | 1/2002 | Miller |
| 6,346,839 | B1 | | 2/2002 | Mnich |
| 6,407,597 | B1 | | 6/2002 | Ishiwaki |
| 6,437,618 | B2 | | 8/2002 | Lee |
| 6,448,820 | B1 | | 9/2002 | Wang et al. |
| 6,469,550 | B1 | * | 10/2002 | Kurd .......................... 327/141 |
| 6,549,041 | B2 | | 4/2003 | Waldrop |
| 6,556,643 | B2 | | 4/2003 | Merritt |
| 6,642,762 | B2 | | 11/2003 | von Kaenel |
| 6,731,667 | B1 | | 5/2004 | Lee et al. |
| 2001/0043086 | A1 | * | 11/2001 | Idei et al. ...................... 327/12 |
| 2002/0005763 | A1 | | 1/2002 | Aoki |
| 2002/0126787 | A1 | * | 9/2002 | Homol et al. ................ 375/376 |

(Continued)

FOREIGN PATENT DOCUMENTS

JP    2000-082954    3/2000

OTHER PUBLICATIONS

C.H. Kim, et al. "A 64 Mbit, 640 Mbyte/s bidirectional Data Strobed, Double-Data-Rate SDRAM with a 40-mW DLL for a 256-Mbyte System", *IEEE J. Solid State Circuits*, 33(11), Nov. 1998.

(Continued)

*Primary Examiner*—Emmanuel Bayard
(74) *Attorney, Agent, or Firm*—Hamilton, Brook, Smith & Reynolds, P.C.

(57) ABSTRACT

An initialization circuit in a delay locked loop ensures that after power up or other reset clock edges are received by a phase detector in the appropriate order for proper operation. After reset of the delay locked loop, the initialization circuit assures that at least one edge of a reference clock is received prior to enabling the phase detector to increase (or decrease) the delay in a delay line. After at least one edge of a feedback clock is received, the initialization circuit enables the phase detector to decrease (or increase) the delay in a delay line.

11 Claims, 11 Drawing Sheets

U.S. PATENT DOCUMENTS

| | | | |
|---|---|---|---|
| 2003/0025539 A1* | 2/2003 | Fiscus | 327/158 |
| 2003/0090296 A1 | 5/2003 | Yoo | |
| 2003/0185329 A1* | 10/2003 | Dickmann | 375/375 |
| 2005/0122815 A1* | 6/2005 | Momtaz et al. | 365/221 |
| 2007/0007941 A1 | 1/2007 | Lin et al. | |

OTHER PUBLICATIONS

Hsiang-Hui Chang, et al. "A Wide Range Delay-Locked Loop With a Fixed Latency of One Clock Cycle", *IEEE J. Solid State Circuits*, 37(8), Aug. 2002.

Hongil Yoon, et al. "A 2.5V, 333-Mb/s/pin, 1-Gbit, Double-Data-Rate Synchronous DRAM", *IEEE J. Solid State Circuits*, 34(11), Nov. 1999.

Se Jun Kim, et al. "A low-Jitter Wide-Range Skew-Calibrated Dual-Loop DLL Using Antifuse Circuitry for High-Speed DRAM", *IEEE J. Solid State Circuits*, 37(6), Jun. 2002.

* cited by examiner

START UP CIRCUIT FOR DELAY LOCKED LOOP

RELATED APPLICATION(S)

This application is a continuation of U.S. application Ser. No. 10/647,664, filed Aug. 25, 2003, now U.S. Pat. No. 7,477,716 which claims the benefit of U.S. Provisional Application No. 60/482,260, filed on Jun. 25, 2003.

The entire teachings of the above application(s) are incorporated herein by reference.

BACKGROUND OF THE INVENTION

A Delay Locked Loop (DLL) with an adjustable delay line is used to synchronize a first clock signal with a second clock signal by delaying the first clock signal. The DLL includes a phase detector, which detects the phase difference between the first clock signal and the second clock signal. Based on the detected phase difference, the DLL synchronizes the first clock signal to the external clock signal by adding an appropriate delay to the first clock signal until the second clock signal is in phase with the first clock signal.

FIG. 1 is a block diagram of a prior art DLL 100. An externally supplied clock (CLK) is buffered by clock buffer 101 to provide a reference clock (CLK_REF) that is coupled to a voltage controlled delay line 102 and a phase detector 104. The voltage controlled delay line 102 produces an output clock (CLK_OUT), which is a delayed version of CLK_REF and is routed to various circuits within the device and to the replica delay circuit 103. The replica delay circuit 103 provides a delay similar to the delay through buffer 101 and wire routing delays. Replica delays are well-known to those skilled in the art. See commonly owned U.S. Pat. No. 5,796,673 to Foss et al for further explanation of replica delays. A feedback clock signal CLK_FB output from the replica delay circuit 103 is coupled to the phase detector 104. Other prior art DLLs use a digital delay line or a tapped delay line. Commonly owned U.S. Pat. Nos. 5,796,673 and 6,087,868 describe such DLLs The phase detector 104 generates phase control signals (UP, DOWN) dependent on the phase difference between CLK_REF and CLK_FB. The DOWN signal is set to a logic '1' on each CLK_REF rising edge and the UP signal is set to a logic '1' on each CLK_FB rising edge. Both UP and DOWN signals are reset to logic '0' when the second rising edge of the two signals is received. Thus, when the CLK_REF rising edge is detected before the CLK_FB rising edge, the DOWN signal transitions to a logic '0' to decrease the delay in the voltage controlled delay line (VCDL) 102 until the next rising edge of the CLK_FB is detected. Alternatively, if CLK_FB rising edge is detected prior to the CLK_REF rising edge, the UP signal is asserted (logic '1') to increase the delay until the next rising edge of CLK_REF is detected.

The phase control signals (UP/DOWN) of the phase detector 104 are integrated by a charge pump 105 and a loop filter 106 to provide a variable bias voltage $V_{CTRL}$ 110 for the VCDL 110. The bias voltage $V_{CTRL}$ selects the delay to be added to CLK_REF by the VCDL 102 to synchronize CLK_FB with CLK_REF.

The phase detector 100 may be level sensitive or edge triggered. Typically, edge triggered phase detectors are used because level sensitive phase detectors are susceptible to false locking. However, the clock is free running, and it is not known which clock edge will occur first after a reset. Thus, dependent on the initial phase relationship between the input signals to the phase detector (i.e. dependent on whether the rising edge of the CLK_REF or CLK_FB occurs first after system reset or power up). The UP (DOWN) signal may be triggered first when the delay should be decreased (increased), so DLLs with edge triggered phase detectors may never achieve lock.

FIG. 2 is a schematic diagram of a prior art edge triggered phase detector 104. The phase detector 104 detects the phase difference between CLK_REF and CLK_FB and sets the UP, DOWN signals to logic '1' dependent on the phase difference to increase or decrease the delay. The phase detector 104 includes two rising edge triggered D-type Flip-Flops (DFF) 201, 203 and a reset circuit 210. The input of each DFF 201, 203 is coupled to $V_{DD}$ and the respective asynchronous reset input of each DFF 201, 203 is coupled to the output (RSTb) of the reset circuit 210. The reset circuit 210 generates a logic '0' on the RSTb signal to reset DFFs 201, 203 when the RESETb signal is at a logic '0' or when both the UP and DOWN signals are at a logic '1'.

The clock input of each DFF is coupled to a respective one of the input signals (CLK_REF, CLK_FB), with the clock input of DFF 201 coupled to CLK_REF and the clock input of DFF 203 coupled to CLK_FB. The output of each DFF 201, 203 is coupled to respective UP/DOWN inputs of charge pump 105 (FIG. 1) to increase or decrease the delay of the VCDL 102 based on the detected phase difference between the clocks.

If a rising edge (transition from a logic '0' to a logic '1') of CLK_REF is detected prior to a rising edge of CLK_FB, the delay is decreased. For example, if the rising edge of CLK_REF occurs before the rising edge of CLK_FB, the DOWN signal is asserted (i.e. the output of DFF 201 changes to a logic '1') to decrease the delay. While the DOWN signal is at logic '1', the charge pump and loop filter decrease the delay in the VCDL 102. The DOWN signal remains at a logic '1' until a subsequent rising edge of CLK_FB clocks DFF 203 and the UP signal at the output of DFF 203 transitions from a logic '0' to a logic '1'. With both UP and DOWN signals at a logic '1', the reset circuit 210 generates a logic '0' pulse on the RSTb signal. The logic '0' pulse on the RSTb signal coupled to the asynchronous reset inputs of DFF 201, 203 resets DFF 201, 203 and the UP and DOWN signals are reset to a logic '0'.

If the rising edge of CLK_FB is detected prior to the rising edge of CLK_REF, the delay is increased, the UP signal transitions from a logic '0' to a logic '1'. While the UP signal is at a logic '1', the charge pump and loop filter increase the delay through the delay line. The UP signal is held at a logic '1' until the rising edge of CLK_REF clocks DFF 203 and the DOWN signal transitions to a logic '1'. With both UP and DOWN signals asserted (at a logic '1'), the reset circuit 210 generates a logic '0' pulse on the RSTb signal and DFFs 201, 203 are reset. After the DFFs 201,203 are reset, the UP and DOWN signals at the outputs of DFFs are reset to a logic '0'.

After a power up or system reset, the voltage controlled delay line is typically set to a minimum delay. If after reset or power up, the rising edge of the CLK_REF signal occurs prior to the rising edge of the CLK_FB signal, the phase detector 104 will set the DOWN signal to a logic '1' to decrease the delay. However, the delay will already be at the minimum allowed. Thus, all subsequent phase detector cycles will continue to try to decrease the DLL delay and the DLL will never achieve lock.

FIG. 3 is a timing diagram that illustrates a clock edge ordering problem after reset. The problem with achieving lock arises when the rising edge of CLK_REF occurs prior to the rising edge of CLK_FB. In the example shown, the rising edge of CLK_REF occurs at the same time as the falling edge of CLK_FB. However, the phase difference is variable and both rising edges may even occur at the same time. FIG. 3 is described in conjunction with the circuit shown in FIG. 2. During reset, the RESETb signal is held at a logic '0' and the delay in the voltage controlled delay line is set to a minimum delay (one unit delay cell). Also, signals UP and DOWN are both held at a logic '0' because DFFs 201, 203 are held reset by a logic '0' on the RESETb signal.

At time 200, the RESETb signal transitions from a logic '0' to a logic '1'. As shown, after reset the rising edge of CLK_REF occurs followed by the rising edge of CLK_FB.

At time 202, the first rising edge (from a logic '0' to a logic '1') on the CLK_REF signal sets DFF 201 and the DOWN signal (the output of DFF 201) is set to a logic '1'. While the DOWN signal is at a logic '1', the delay in the delay line is decreased. However the DLL delay is already at the minimum value set while RESETb was at a logic '0'. Thus, the logic '1' on the DOWN signal has no effect on the delay of VCDL.

At time 204, the rising edge detected on the CLK_FB signal sets DFF 203 resulting in setting the UP signal (the output of DFF 203) to a logic '1'. With both the UP signal and the DOWN signal at a logic '1', the reset circuit 210 generates a logic '0' pulse on the RSTb signal to reset both DFFs 201, 203 and the UP and DOWN signals to a logic '0' at time 206.

This sequence is repeated starting with the next rising edge of CLK_REF at time 208 and continues for each subsequent rising edge of CLK_REF and CLK_FB. The delay remains stuck at the minimum delay, and thus the DLL never achieves lock.

SUMMARY OF THE INVENTION

An initialization circuit in a delay locked loop that ensures proper ordering of clock signals to a phase detector after reset is presented. The delay locked loop includes a delay circuit that provides a delay to a reference clock to generate a feedback clock. The delay circuit has a delay range. A phase detector in the delay locked loop compares phase of the reference clock and the feedback clock to change the delay of the delay circuit. After reset, the initialization circuit assures that the phase detector initially change the delay in a direction away from a first end of the delay range after receipt of one of the reference clock and the feedback clock and enables a change in the delay in an opposite direction toward the first end only after receipt of one of the reference clock and the feedback clock followed by receipt of the other of the reference clock and the feedback clock.

The first end of the delay range may be a minimum delay and the direction away from the first end increases the delay and the opposite direction towards the first end decreases the delay. The initialization circuit increases the delay after receipt of the reference clock and enables decrease in the delay only after receipt of the reference clock followed by the feedback clock. The initialization circuit may include a first latch and a second latch with the input of the second latch coupled to the output of the first latch. The first latch is responsive to the reference clock and detects a first edge of the reference clock to enable change in the delay in the direction away from the first end. The second latch is responsive to the feedback clock and detects an edge of the feedback clock after the first edge of the reference clock has been detected by the first latch, to enable change in the delay in the opposite direction.

In an alternate embodiment, further delay may added to allow the clocks to stabilize by adding two latches to the initialization circuit. The input of a third latch is coupled to the output of the first latch and the input of a fourth latch is coupled to the output of the third latch. The third latch detects a next edge of the reference clock to delay the enabling of the phase detection circuit in the first direction for at least one reference clock period. The fourth latch detects a next edge of the feedback clock to delay the enabling of the adjustment of the phase detector in the other direction for at least one feedback clock period.

The first edge of the reference clock may be a rising edge and the edge of the feedback clock is a rising edge.

In an alternate embodiment, the initialization circuit may include a first latch and a second latch. The first latch is responsive to the feedback clock and detects a first edge of the feedback clock to enable change in the delay in the direction away from the first end. The second latch is responsive to the reference clock, which detects an edge of the reference clock after the first edge of the feedback clock has been detected by the first latch to enable change in the delay in the opposite direction. The input of the second latch coupled to the output of the first latch.

The phase detector may include a latch responsive to the reference clock to generate a first phase control signal and another latch responsive to the feedback clock to generate a second phase control signal.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
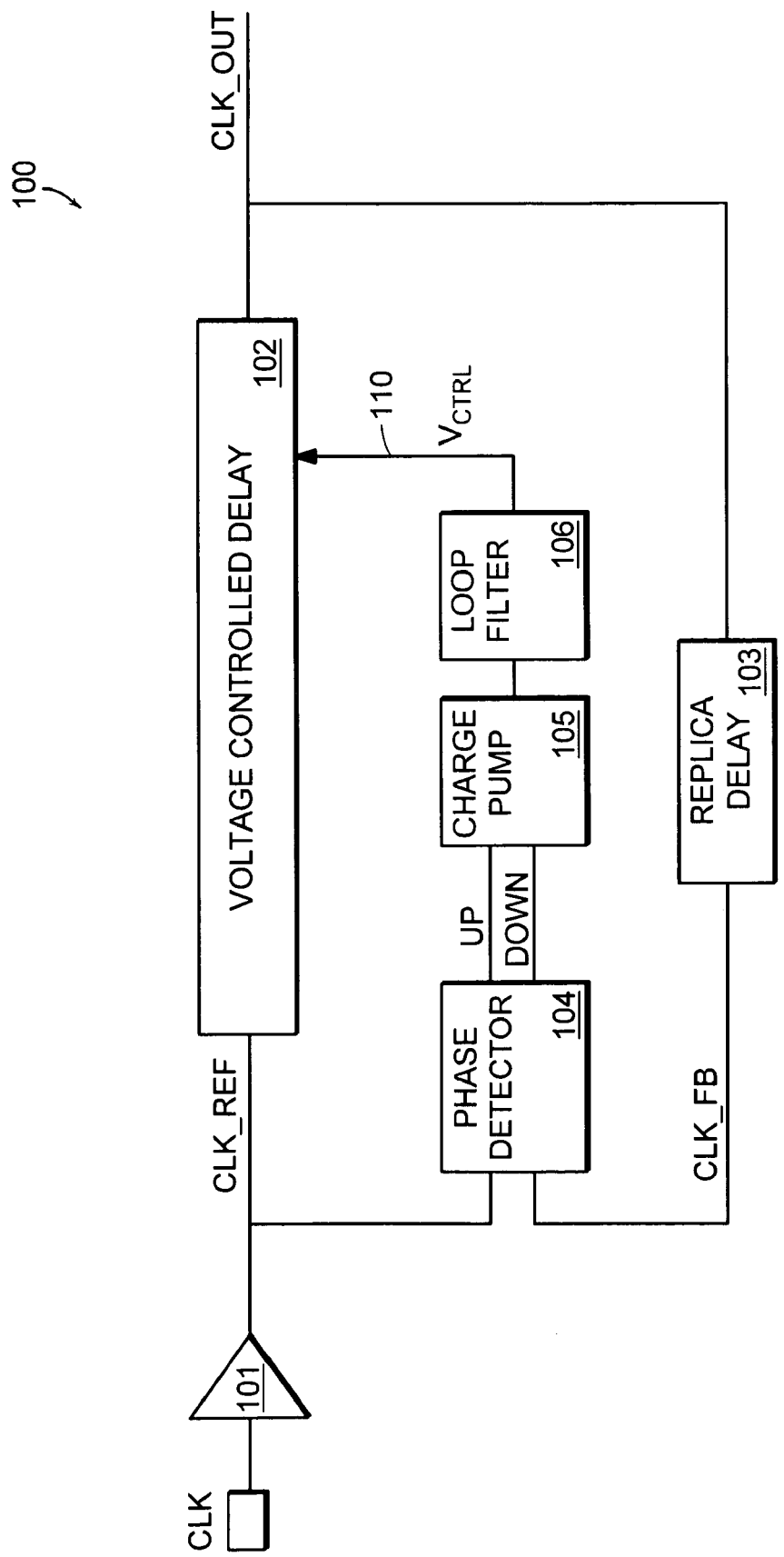
FIG. 1 is a block diagram of a typical prior art delay locked loop (DLL)
Figure 4:
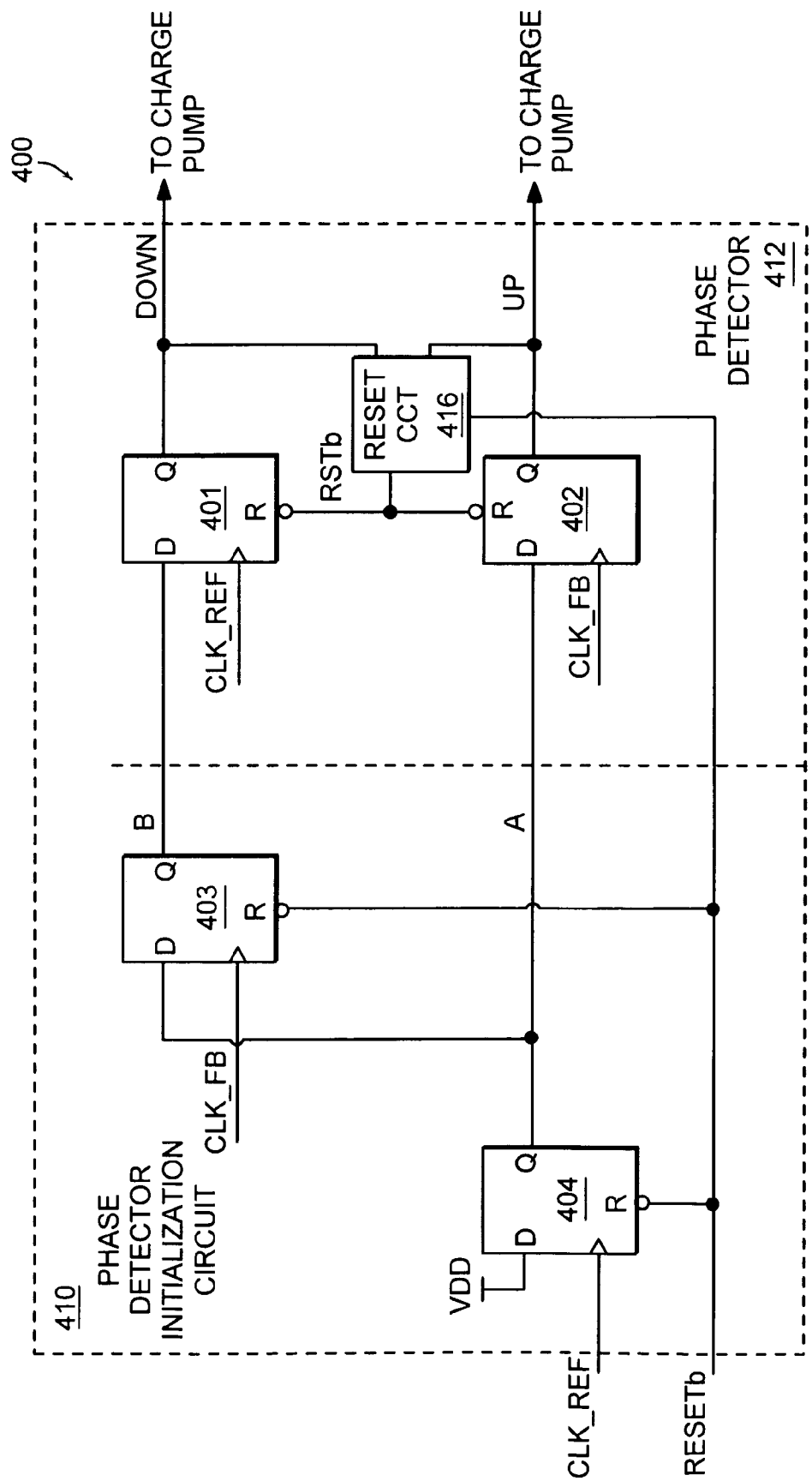
FIG. 4 is a schematic diagram of an edge triggered phase detection circuit including phase detector initialization circuit according to the principles of the present invention.

FIG. 4 is a schematic diagram of an edge triggered phase detection circuit 400 including phase detector initialization circuit 410 according to the principles of the present invention. The phase detection circuit 400 replaces the phase detector 104 of FIG. 1 to provide a novel DLL. The phase detection circuit 400 includes a phase detector 412 that detects the phase difference between a reference clock (CLK_REF) signal and a feedback clock (CLK_FB) signal. The outputs (UP, DOWN) of the phase detector 412 are coupled to respective UP/DOWN inputs of a charge pump as described in conjunction with the phase detector 104 shown in FIG. 1 to increase or decrease the delay of the reference clock based on the detected phase difference between the clocks.

The delay can range from a minimum value to a maximum value. In a voltage controlled delay line the control voltage has a range of allowed values. One end of that range corresponds to a minimum delay value for the VCDL and the other end of that range corresponds to a maximum delay value for the VCDL. The operation of a VCDL is well understood in the art and will not be discussed further. Other DLLs which use a digital delay line have a minimum delay value usually equal to one unit delay in the digital delay line and a maximum delay value usually equal to the number of unit delays in the digital delay line. In the embodiment shown, the delay of the DLL is reset to the minimum value at reset. The phase detector initialization circuit 410 coupled to the phase detector 412 at node A and node B ensures the correct ordering of the detection of clock edges after reset.

Figure 2:
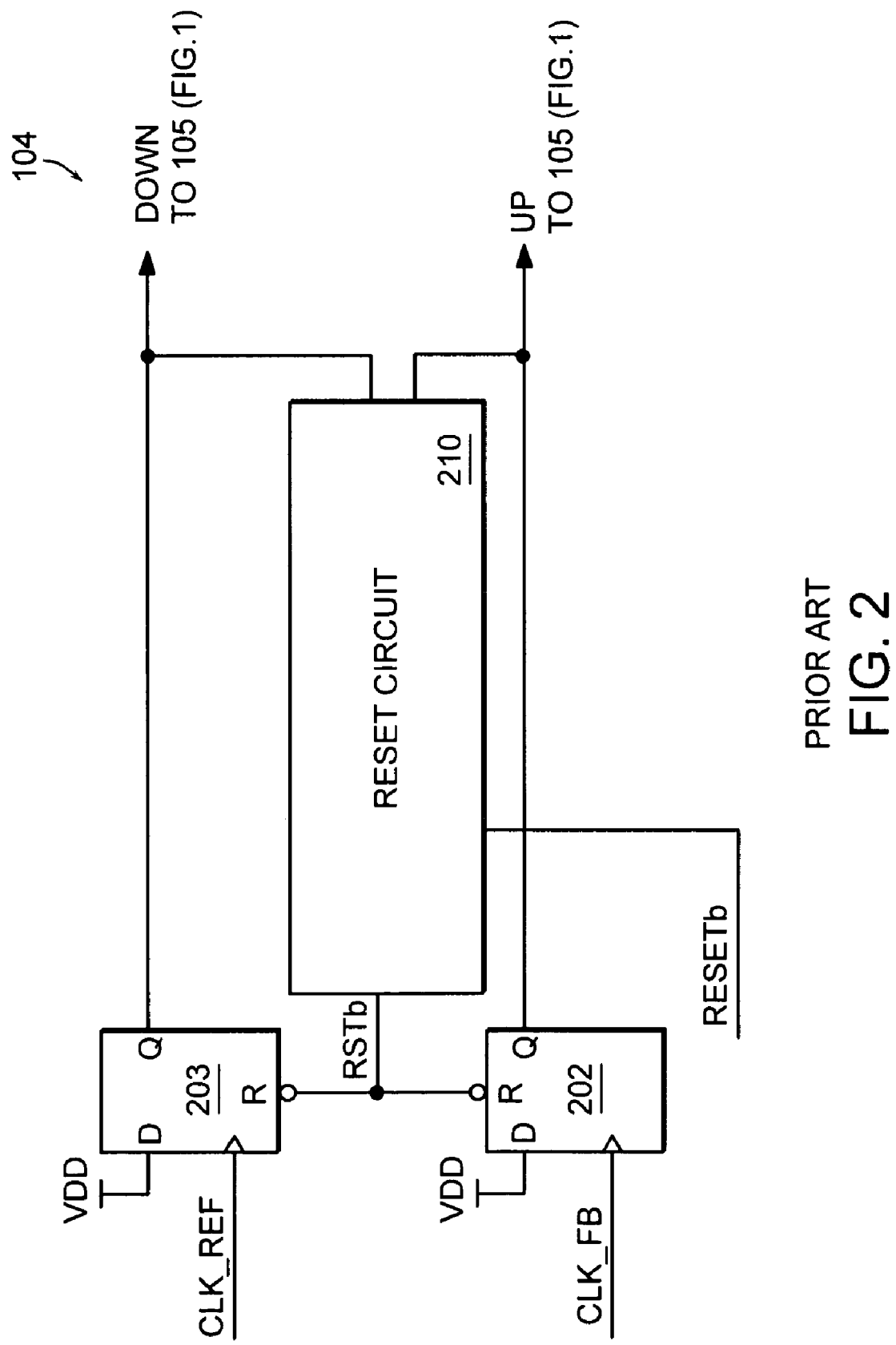
FIG. 2 is a schematic diagram of a typical prior art phase detector.
Figure 3:
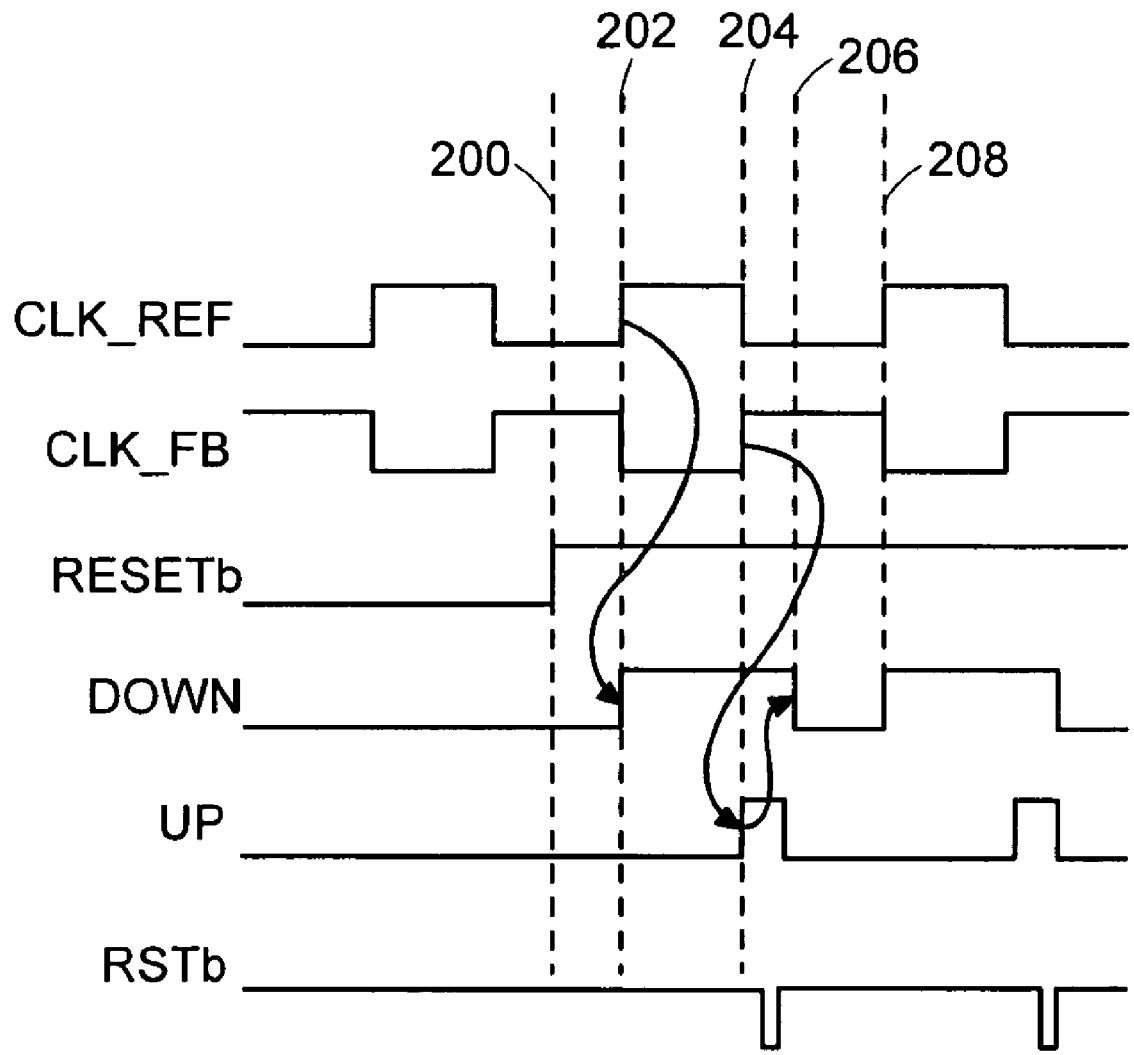
FIG. 3 is a timing diagram that illustrates a clock edge ordering problem after reset.

To ensure correct ordering, the phase detector initialization circuit 410 disables the operation of the phase detector 412 until after the first rising edge of the CLK_REF has been detected after reset. After the phase detector initialization circuit 410 detects the first rising edge of CLK_REF, the state of the phase detector 412 is set to allow an increase in the DLL delay. The phase detector initialization circuit 410 further delays enabling a decrease of the delay by the phase detector 412 until the next CLK_FB rising edge to ensure that the delay is always increased after a system or power up reset even when there is no initial phase difference between the clocks. After the initial increase in the delay, the phase detector 412 operates as described in conjunction with the prior art phase detector described in conjunction with FIGS. 2 and 3. By detecting the rising edge of CLK_REF first after reset, and delaying the detection of the first rising edge of CLK_FB prior to enabling phase detection, the delay is always increased after reset. By always automatically increasing the delay after reset, the no-lock condition in the prior art phase detector described in conjunction with FIGS. 2 and 3 is never encountered.

The phase detector initialization circuit 410 includes two DFFs 404, 403. DFF 404 detects the first rising edge of CLK_REF after reset and enables an increase in the delay by setting node A to a logic '1'. DFF 403 delays enabling a decrease in the delay by holding node B at a logic '0' until after the next rising edge of CLK_FB.

The phase detection circuit 402 includes two DFFs 401, 402 and reset circuit 416. The output of DFF 404 (node A) is coupled to the D input of DFF 402 and the output of DFF 403 (node B) is coupled to the D input of DFF 401. The respective asynchronous reset input of each DFF 401, 402 is coupled to the output (RSTb) of the reset circuit 416. The RSTb signal is set to a logic '0' to reset DFFs 401,402 during a reset while the RESETb signal is held at a logic '0' or while both the UP and DOWN signals are at a logic '1'.

The clock input of each DFF 401, 402 is coupled to a respective one of the input clock signals (CLK_REF, CLK_FB), with the clock input of DFF 401 coupled to CLK_REF and the clock input of DFF 402 coupled to CLK_FB. The output of each DFF 401, 402 is coupled to respective UP/DOWN inputs of a charge pump to increase or decrease the delay based on the detected phase difference between the clocks.

Figure 5:
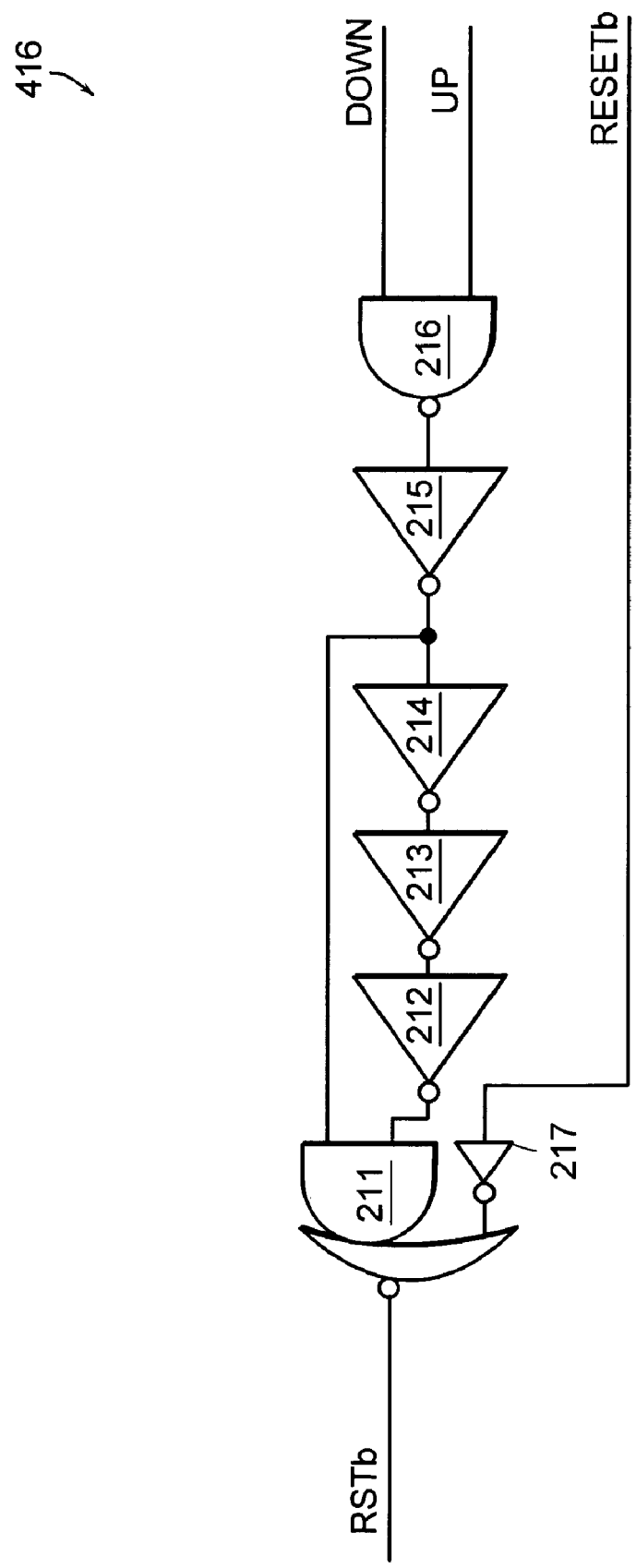
FIG. 5 is a circuit diagram of an embodiment of the reset circuit shown in FIG. 4.

FIG. 5 is a circuit diagram of an embodiment of the reset circuit 416 shown in FIG. 4. The reset circuit 416 includes a plurality of inverters 215, 213, 212, 217, a NAND gate 216 and an AND-OR-INVERTER 211. A truth table describing the operation of the reset circuit is shown in Table 1 below.

TABLE 1

| INPUTS | | | OUTPUT |
|---|---|---|---|
| UP | DOWN | RESETb | RSTb |
| X | X | 0 | 0 |
| 0 | 1 | X | 1 |
| 1 | 0 | X | 1 |
| 1 | 1 | X | 0 |

During reset the RESETb signal is set to a logic '0' and the RSTb signal is set to a logic '0' at the input of inverter 217. The logic '1' at the output of inverter 217 coupled to one of the inputs of the AND-OR-INVERTER 211 results in a logic '0' on the RSTb signal.

When both the UP and DOWN outputs of the phase detector circuit 412 transition to a logic '1', the RSTb signal is set to a logic '0' for the length of time equal to the propagation delay through inverters 212, 213, 214. The output of inverter 212 is at a logic '1' prior to both the DOWN and UP signals transitioning to a logic '1' at the inputs of NAND gate 216. With both inputs of NAND gate 216 at a logic '1', the output of NAND gate 216 transitions to a logic '0'. The logic '0' at the input of inverter 215 results in a logic '1' at the output of inverter 215 coupled to the input of AND-OR-INVERTER 211. With both inputs of AND-OR-INVERTER 211 at a logic '1', the RSTb signal transitions to a logic '0'. The RSTb signal transitions back to a logic '1' after the logic '1' on the input of inverter 214 propagates through inverters 213, 212 resulting in a logic '0' on the input of AND-OR-INVERTER 211 coupled to the output of inverter 212. This results in a logic '0' pulse on the RSTb signal.

Figure 6:
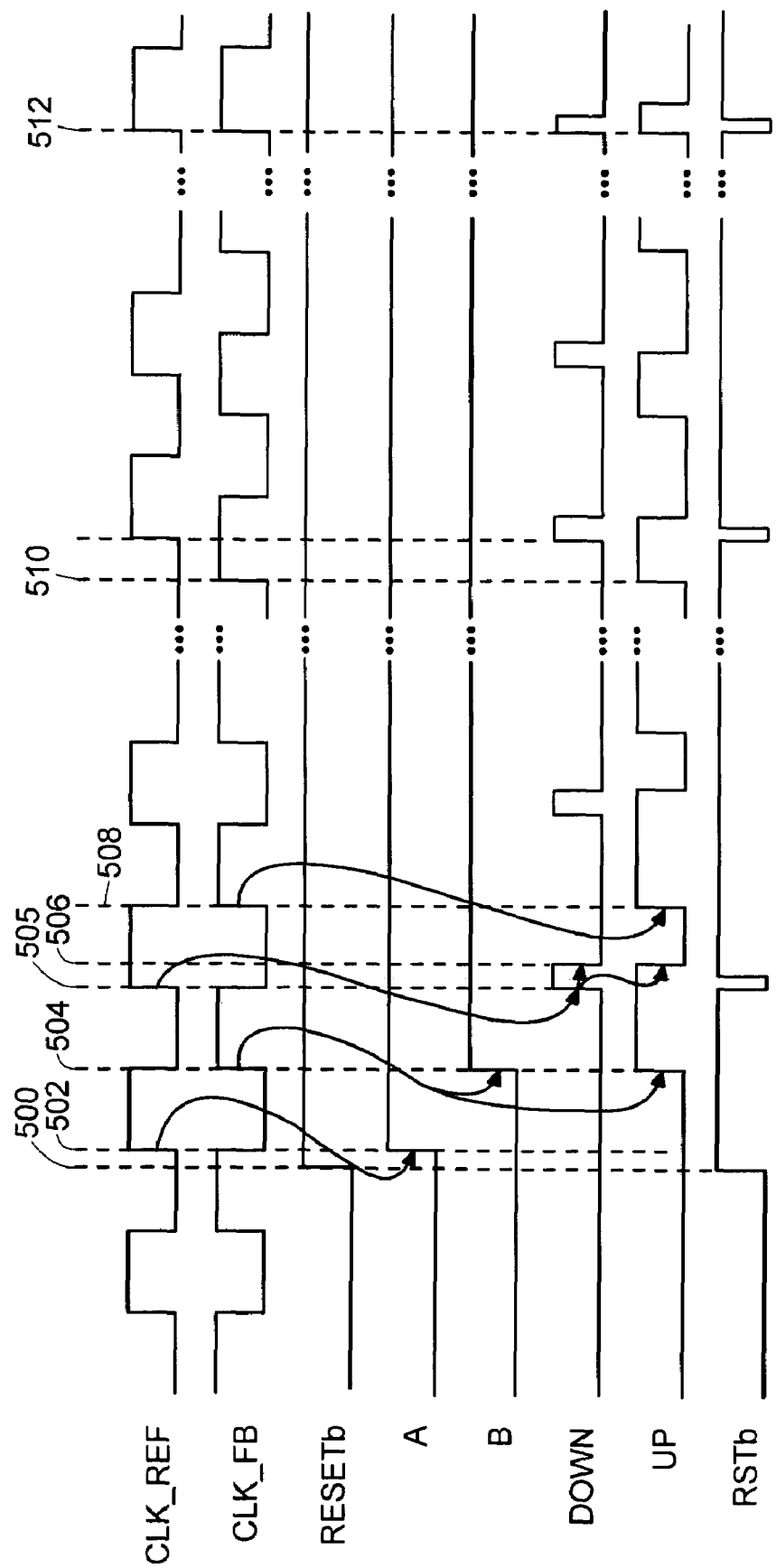
FIG. 6 is a timing diagram that illustrates the operation of the circuit shown in FIGS. 4 and 5.
Figure 7:
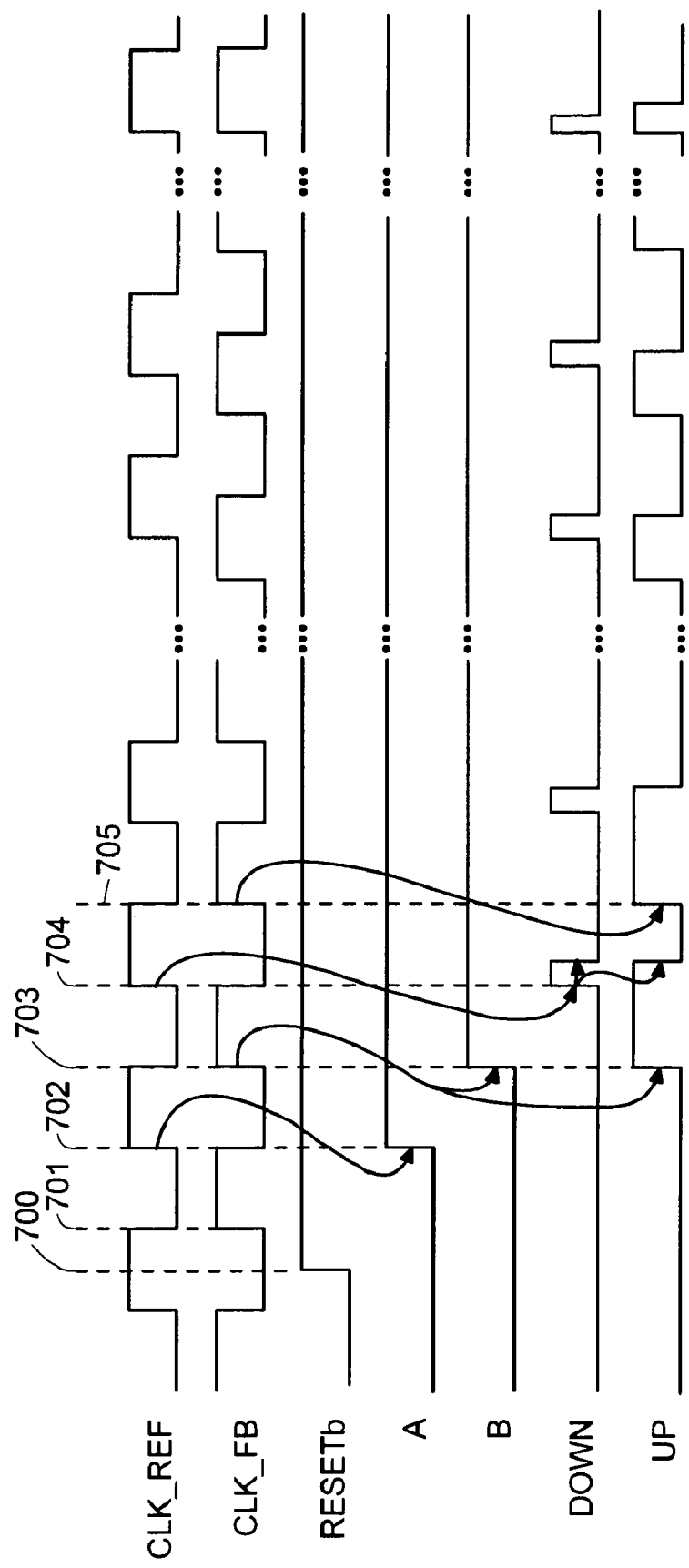
FIG. 7 is a timing diagram illustrating the operation of the circuit shown in FIG. 4 when the rising edge of the feedback clock precedes the rising edge of the reference clock after reset.

The operation of the circuit shown in FIGS. 4 and 5 is described in conjunction with the timing diagrams shown in FIG. 6 and FIG. 7. FIG. 6 illustrates the case when the rising edge of the reference clock precedes the rising edge of the feedback clock after reset and FIG. 7 illustrates the case when the rising edge of the feedback clock precedes the rising edge of the reference clock after reset.

FIG. 6 is a timing diagram that illustrates the operation of the circuit shown in FIGS. 4 and 5.

The outputs of DFFs 403, 404 are coupled at nodes B and A to respective D-inputs of DFFs 401, 402. Prior to time 500 in FIG. 6, during reset, the RESETb signal is held at a logic '0' and the delay in the voltage controlled delay line is set to a minimum delay. In a wide frequency range DLL the minimum delay of the delay line may be greater than the period of CLK_REF. While the RESETb signal and RSTb signal are at a logic '0' and there is a logic '0' on the respective D-inputs of DFFs 401, 402, 403, a rising edge on the CLK_FB signal or the CLK_REF signal has no effect on the output signals (UP, DOWN).

RSTb is coupled to the respective asynchronous reset inputs of DFFs 401, 402 and RESETb is coupled to the respective asynchronous reset inputs of DFFs 403, 404. Nodes A and B are held at a logic '0' signals because DFFs 403, 404 are held reset by the RESETb signal. Also, UP and DOWN signals at the output of DFFs 401, 402 are both held at a logic '0' because the RSTB signal output by the reset circuit 410 is held at a logic '0' while RESETb is at a logic '0' as described in conjunction with FIG. 5.

At the end of the reset cycle, at time 500, the RESETb signal transitions to a logic '1' allowing DFFs 404, 403 to change state. After reset, the first rising edge (transition from logic '0' to logic '1') of CLK_REF occurs before the first rising edge of the CLK_FB signal.

At time 502, the first rising edge on the CLK_REF signal sets DFF 404 and the signal at node A (the output of DFF 404) transitions from a logic '0' to a logic '1'. A logic '1' on node A allows DFF 402 to set the UP signal to increase the delay after the next rising edge of CLK_FB is detected.

At time 504, the first rising edge of CLK_FB sets DFF 402 and the UP signal (the output of DFF 402) transitions from a logic '0' to a logic '1'. The first rising edge of CLK_FB also sets DFF 403 and the signal at node B (the output of DFF 403) transitions from a logic '0' to a logic '1' allowing the delay to be decreased on the next rising edge of CLK_REF. While the UP signal is at logic '1', the delay is increased.

DFF 403 in the phase detector initialization circuit 410 ensures that the delay will always be increased after a reset even if there is no initial phase difference between the signals (CLK_REF and CLK_FB). The time that the UP signal is held at a logic '1' prior to the DOWN signal being set to a logic '1' by DFF 401 is dependent on the initial phase difference between the CLK_FB and CLK_REF.

At time 505, with a logic '1' at the D-input of DFF 401, the rising edge of CLK_REF latches a logic '1' at the output of DFF 401. With both outputs (DOWN, UP) of DFFs 401, 402 at a logic '1', a logic '0' pulse is generated on the RSTb signal by the reset circuit 416 to reset DFFs 401,402. At time 506, both DFFs 401, 402 are reset and both outputs (DOWN, UP) are reset to logic '0'. DFFs 403, 404 are not reset. Instead, they remain in the set state with logic '1' on the respective outputs at nodes A, B until the next reset is detected.

Thus, after the initial increase in the delay, the phase detector 412 controls the generation of the phase control signals (UP/DOWN) to further increase or decrease the delay until lock is achieved. The phase detector 412 continues to increase the delay by generating further UP signal transitions as shown at time 508 and 510 until at time 512 the DLL is in the lock state. The phase detector 412 continuously monitors the phase difference between the CLK_REF signal and the CLK_FB signal and adjusts the delay by setting the UP/DOWN signals appropriately to achieve lock.

FIG. 7 is a timing diagram illustrating the operation of the circuit shown in FIG. 4 when the first rising edge of the feedback clock occurs before the first rising edge of the reference clock after reset.

At time 700, the RESETb signal transitions from a logic '0' to a logic '1'. At time 701, the rising edge of CLK_FB is ignored by DFFs 403, 402 because the first rising edge of CLK_REF has not yet been detected by DFF 404.

At time 702, the first rising edge on CLK_REF sets DFF 404 and node A transitions from a logic '0' to a logic '1'.

At time 703, a next rising edge of the CLK_FB signal sets DFF 402 and the UP signal (the output of DFF 402) transitions from a logic '0' to a logic '1'. That rising edge of the CLK_FB signal also sets DFF 403 and node B transitions from a logic '0' to a logic '1'.

At time 704, with a logic '1' on node B (the D-input of DFF 401), the rising edge of CLK_REF latches a logic '1' at the output of DFF 401. With both outputs (DOWN, UP) of DFFs 401, 402 at a logic '1', a logic '0' pulse is generated on the RSTb signal by the reset circuit 416 to reset DFFs 401, 402 and both outputs (DOWN, UP) are set to a logic '0'.

After the first transition of the UP signal to a logic '1' to initially increase the delay, the phase detector 412 controls the generation of the output signals (UP/DOWN) to further increase or decrease the delay until lock is achieved. The phase detection circuit continues to increase the delay by setting the UP signal to logic '1' as shown at time 705.

Figure 8:
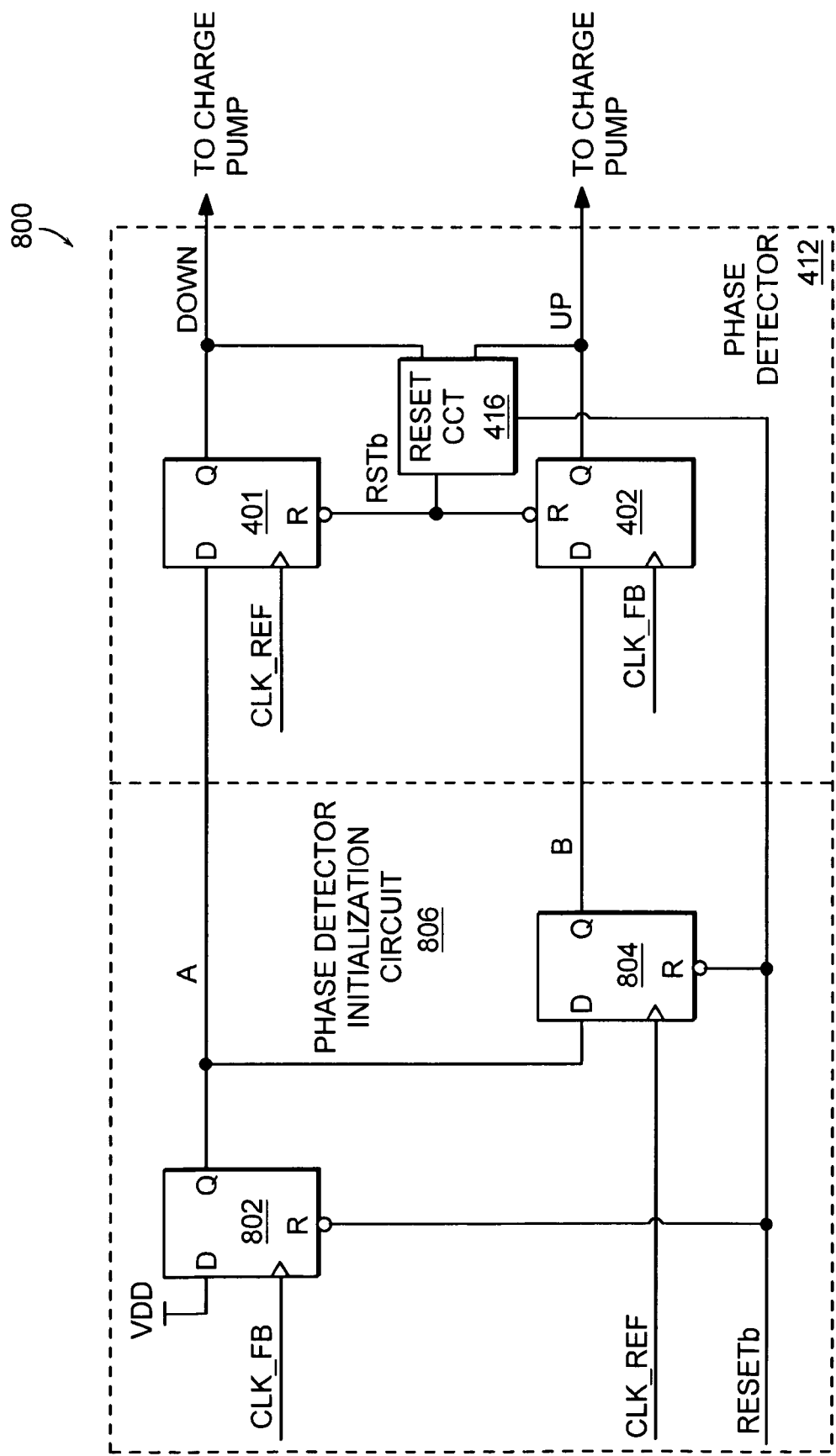
FIG. 8 is a schematic diagram of an alternate embodiment of the phase detection circuit shown in FIG. 4 for use in a DLL in which the delay is reset to the maximum value at reset.

FIG. 8 is a schematic diagram of an alternate embodiment of the phase detection circuit 800 shown in FIG. 4 for use in a DLL in which the delay is reset to the maximum value at reset. The phase detector initialization circuit 806 coupled to the phase detector 412 at node A and node B ensures the correct ordering of the detection of clock edges after reset.

To ensure correct ordering, the phase detector initialization circuit 806 disables the operation of the phase detector 412 until after the first rising edge of the CLK_FB has been detected after reset. After the phase detector initialization circuit 806 detects the first rising edge of CLK_FB, the state of the phase detector 412 is set to allow a decrease in the DLL delay. The phase detector initialization circuit 806 further delays enabling a increase of the delay by the phase detector 412 until the next CLK_REF rising edge to ensure that the delay is always decreased after a system or power up reset even when there is no initial phase difference between the clocks. After the initial decrease in the delay, the phase detector 412 operates as described in conjunction with the prior art phase detector described in conjunction with FIGS. 2 and 3. By detecting the rising edge of CLK_FB first after reset, and delaying the detection of the first rising edge of CLK_REF prior to enabling phase detection, the delay is always decreased after reset. By always automatically decreasing the delay after reset, the no-lock condition in the prior art phase detector described in conjunction with FIGS. 2 and 3 is never encountered.

The phase detector initialization circuit 806 includes two DFFs 802, 804. DFF 802 detects the first rising edge of CLK_FB after reset and enables a decrease in the delay by setting node A to a logic '1'. DFF 804 delays enabling an increase in the delay by holding node B at a logic '0' until after the next rising edge of CLK_REF.

The phase detection circuit 402 includes two DFFs 401, 402 and reset circuit 416. The output of DFF 802 (node A) is coupled to the D input of DFF 401 and the output of DFF 804 (node B) is coupled to the D input of DFF 402. The respective asynchronous reset input of each DFF 401, 402 is coupled to the output (RSTb) of the reset circuit 416. The RSTb signal is set to a logic '0' to reset DFFs 401, 402 during a reset while the RESETb signal is held at a logic '0' or while both the UP and DOWN signals are at a logic '1'.

The clock input of each DFF 401, 402 is coupled to a respective one of the input clock signals (CLK_REF, CLK_FB), with the clock input of DFF 401 coupled to CLK_REF and the clock input of DFF 402 coupled to CLK_FB. The output of each DFF 401, 402 is coupled to respective UP/DOWN inputs of a charge pump to increase or decrease the delay based on the detected phase difference between the clocks.

Figure 9:
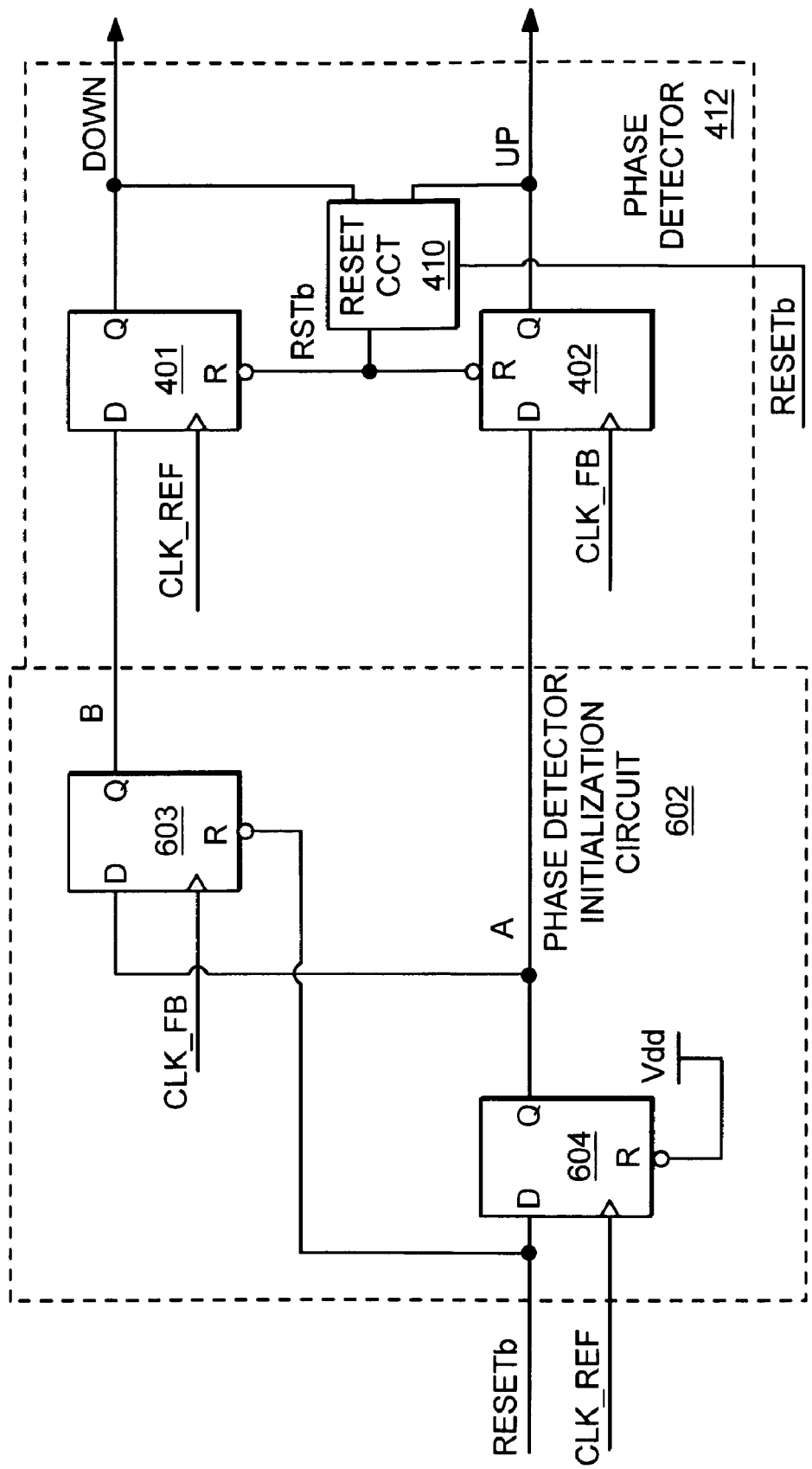
FIG. 9 is a schematic diagram of an alternate embodiment of the phase detector initialization circuit.

FIG. 9 is a schematic diagram of an alternate embodiment of the phase detector initialization circuit. In this embodiment the signals coupled to the data input and asynchronous reset input of DFF 604 which detects the first rising edge of CLK_REF after reset differ from the embodiment shown in FIG. 4. The data input to DFF 604 is coupled to RESETb signal instead of Vdd and the asynchronous reset input is coupled to Vdd instead of the RESETb. DFF 604 is reset after the first rising edge of CLK_REF when RESETb is at a logic '0'. DFF 604 is set with a logic '1' on node A after the first rising edge of CLK_REF after RESETb transitions from a logic '0' to a logic '1'. After DFF 604 detects the first rising edge of CLK_REF, the operation of the circuit is the same as described in conjunction with the embodiment shown in FIG. 4.

Figure 10:
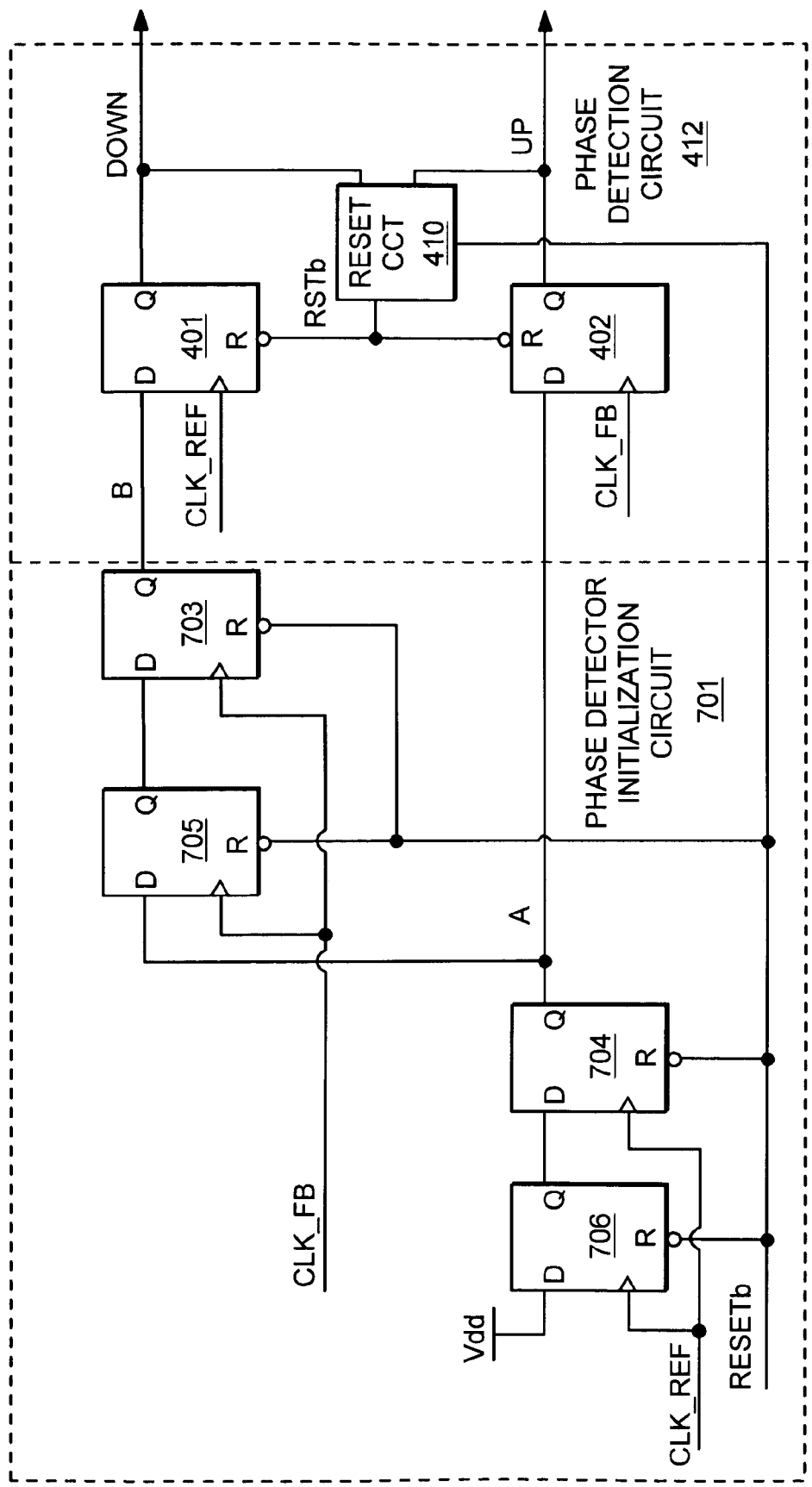
FIG. 10 is yet another embodiment of the phase detector initialization circuit.

FIG. 10 is yet another embodiment of the phase detector initialization circuit. To allow the clocks to stabilize after a reset or on power up, additional DFFs can be added to the phase detector initialization circuit described in conjunction with FIG. 4 so that more than one rising edge is detected on CLK_REF prior to enabling the phase detection circuit, An additional DFF 706 is coupled to DFF 704. CLK_REF is also coupled to the clock input of DFF 706. Thus, the transition of node A from a logic '0' to a logic '1' occurs after the second rising edge of CLK_REF is detected by DFF 704. The additional delay (one CLK_REF period) allows the clocks (CLK_REF and CLK_FB) to stabilize after the circuit has been reset. Those skilled in the art will appreciate that any desired number of stages may be added to further increase the number of CLK_REF rising edges detected prior to enabling the phase detection circuit.

An additional DFF 705 is also coupled between DFF 705 and DFF 701. The clock input of DFF 705 is coupled to the CLK_FB signal and the asynchronous reset input is coupled to the RESETb signal. The output of DFF 705 is coupled to the input of DFF 703. The additional DFF 705 delays the transition of the DOWN signal from a logic '0' to a logic '1' and thus increases the time that the UP signal is initially set at a logic '1' to increase the delay. Those skilled in the art will appreciate that any desired number of stages may be added to further increase the time that the UP signal is held at logic '1'.

Figure 11:
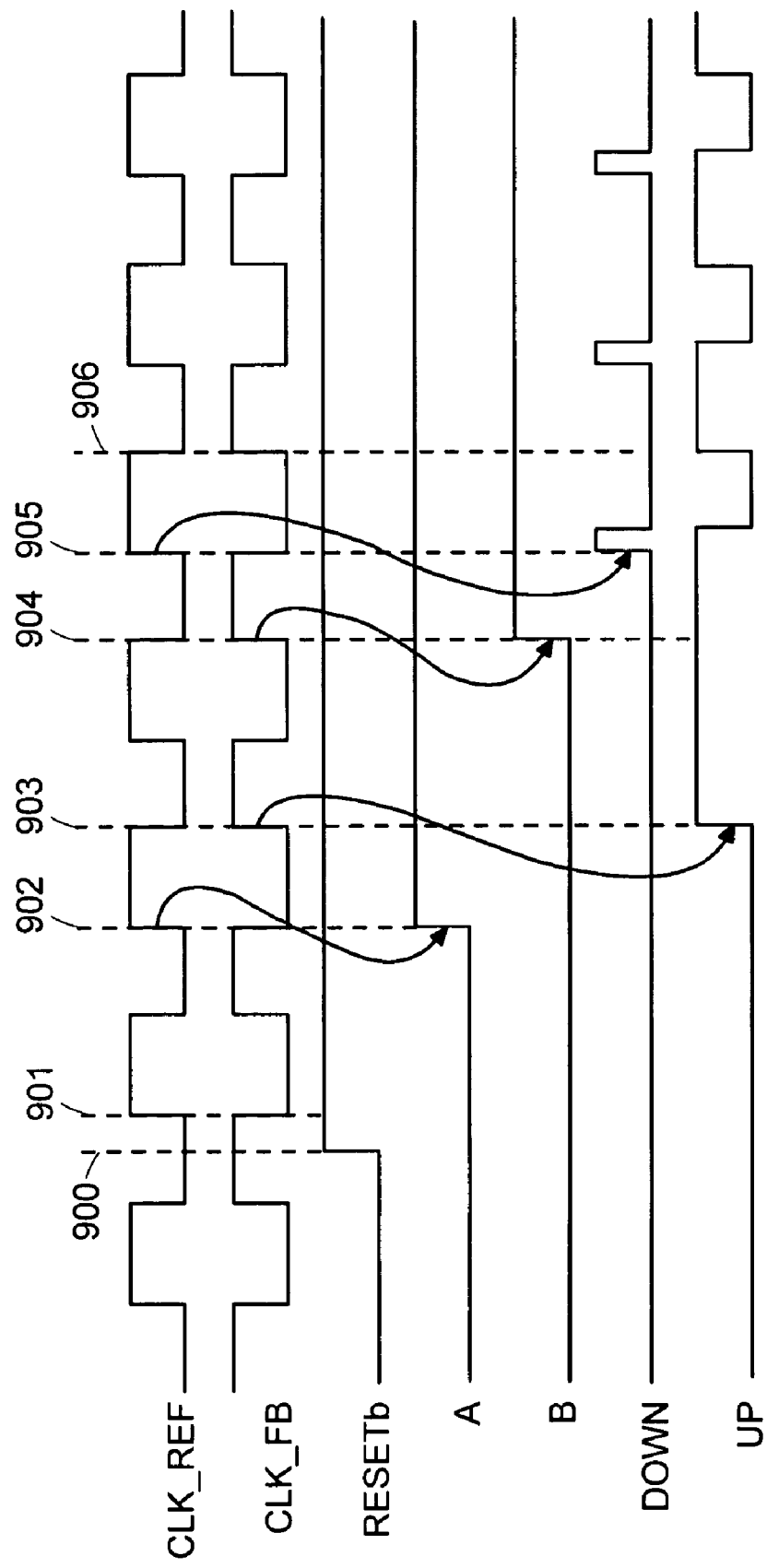
FIG. 11 is a timing diagram illustrating the operation of the circuit of FIG. 9 when the rising edge of the reference clock precedes the rising edge of the feedback clock.

FIG. 11 is a timing diagram illustrating the operation of the circuit of FIG. 10. The outputs of DFFs 703, 704 are coupled at nodes A and B to respective inputs of DFFs 401, 402. Prior to time 900, during reset, the RESETb signal is held at a logic '0' and the delay set to a minimum delay. While the RESETb signal and RSTb signal are at a logic '0' on the respective D-inputs of DFFs 401, 402, 403, 704, 705, 706, a rising edge on the CLK_FB signal or the CLK_REF signal has no effect on the output signals (UP, DOWN).

At time 900, the RESETb signal transitions to a logic '1' allowing the DFFs to change state.

At time 901, the first rising edge on CLK_REF sets DFF 706 and the output of DFF 706 transitions from a logic '0' to a logic '1'.

At time 902, the second rising edge on CLK_REF sets DFF 704 and node A (the output of DFF 404) transitions from a logic '0' to a logic '1'. A logic '1' on node A enables an increase in the delay through DFF 402 in the phase detection circuit 412.

At time 903, a subsequent rising edge of the CLK_FB signal sets DFF 402 and the UP signal (the output of DFF 402) transitions from a logic '0' to a logic '1'. The subsequent rising edge of the CLK_FB signal also sets DFF 705.

At time 904, the next rising edge of the CLK_FB signal sets DFF 703 and the signal at node B (the output of DFF 403) transitions from a logic '0' to a logic '1'. While the UP signal is at logic '1', the delay is increased.

At time 905, with a logic '1' at the input of DFF 401, the next rising edge of CLK_REF latches a logic '1' at the output of DFF 401. With both outputs (DOWN, UP) of DFFs 401, 402 at a logic '1', a logic '0' pulse is generated on the RSTb signal by the reset circuit 416 to reset DFFs 401, 402 and both outputs (DOWN, UP) are set to a logic '0'.

In alternate embodiments the delay line can be set to the maximum delay (total delay of all unit cells in the voltage control delay line) on reset and the phase detector can be configured to automatically decrease the delay. Additionally the present invention has been described using rising edge triggered flip-flops, however falling edge triggered DFFs can also be used. Further, the invention has been described using a voltage controlled delay line, however digital or tapped delay lines can also be used.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus comprising:
   first and second latches; and
   a circuit configured to enable the first and second latches in response to a reset signal, the circuit comprising:
      a first arrangement of a plurality of stages, each stage having a storage element clocked by a first clock signal, an output of the first arrangement electrically connected to the first latch; and
      a second arrangement of a plurality of stages, each stage having a storage element clocked by a second clock signal, the second arrangement receiving the output of the first arrangement, an output of the second arrangement electrically connected to the second latch.

2. The apparatus of claim 1, wherein the first arrangement, in response to the reset signal, enables the first latch after a delay corresponding to the number of stages of the first arrangement.

3. The apparatus of claim 2, wherein the delay is a duration of at least a number of clock cycles of the first clock signal corresponding to one less than the number of stages of the first arrangement.

4. The apparatus of claim 1, wherein the second arrangement in response to the reset signal, enables the second latch after a delay corresponding to the number of stages of the first arrangement and the second arrangement.

5. The apparatus of claim 4, wherein the delay is a duration of at least 1) a number of clock cycles of the first clock signal corresponding to one less than the number of stages of the first arrangement, and 2) a number of clock cycles of the second clock signal corresponding to one less than the number of stages of the second arrangement.

6. The apparatus of claim 1, wherein the frequencies of the first and second clock signals are substantially equal.

7. The apparatus of claim 1, wherein the storage elements each include a latch.

8. The apparatus of claim 7, wherein the latches of successive stages are electrically connected via a respective output and a respective input.

9. The apparatus of claim 1, wherein the first latch is clocked by the second clock signal, and the second latch is clocked by the first clock signal.

10. The apparatus of claim 1, wherein the first latch generates a control signal responsive to the second clock signal, and the second latch generates a control signal responsive to the first clock signal.

11. An apparatus comprising:
    first and second latches; and
    a circuit configured to enable the first and second latches in response to a reset signal, the circuit comprising:

a first arrangement of a plurality of stages, each stage having a latch clocked by a reference clock signal, an output of the first arrangement electrically connected to the first latch; and a second arrangement of a plurality of stages, each stage having a latch clocked by a feedback clock signal, the second arrangement receiving the output of the first arrangement, an output of the second arrangement electrically connected to the second latch.

* * * * *